United States Patent
Chidambaram et al.

(10) Patent No.: US 7,847,401 B2
(45) Date of Patent: Dec. 7, 2010

(54) METHODS, SYSTEMS AND STRUCTURES FOR FORMING SEMICONDUCTOR STRUCTURES INCORPORATING HIGH-TEMPERATURE PROCESSING STEPS

(75) Inventors: P R Chidambaram, Richardson, TX (US); Haowen Bu, Plano, TX (US); Rajesh Khamankar, Coppell, TX (US); Douglas T Grider, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 12/437,004

(22) Filed: May 7, 2009

(65) Prior Publication Data
US 2009/0224296 A1 Sep. 10, 2009

Related U.S. Application Data

(62) Division of application No. 11/046,141, filed on Jan. 28, 2005, now Pat. No. 7,553,718.

(51) Int. Cl.
*H01L 21/00* (2006.01)
(52) U.S. Cl. ............... 257/757; 257/E21.576; 257/E21.589; 257/E29.183; 257/E29.256; 257/E29.312
(58) Field of Classification Search ......... 257/757–789, 257/E21.066, 311–314, 576–589, 29.183, 257/256, 312
See application file for complete search history.

(56) References Cited

U.S. PATENT DOCUMENTS

| | | | |
|---|---|---|---|
| 4,606,998 A * | 8/1986 | Clodgo et al. ............... 430/312 |
| 5,131,978 A | 7/1992 | O'Neill |
| 5,827,761 A | 10/1998 | Fulford et al. |
| 5,858,843 A | 1/1999 | Doyle et al. |
| 6,022,815 A | 2/2000 | Doyle et al. |
| 6,133,151 A | 10/2000 | Lin |
| 6,165,826 A | 12/2000 | Chau et al. |
| 6,333,245 B1 | 12/2001 | Furukawa et al. |
| 6,479,350 B1 | 11/2002 | Ling et al. |
| 6,541,372 B2 * | 4/2003 | Wege et al. ............... 438/633 |
| 6,583,037 B2 | 6/2003 | Cho et al. |
| 6,821,853 B1 | 11/2004 | Buller et al. |
| 6,861,317 B1 | 3/2005 | Verma et al. |
| 7,118,952 B2 | 10/2006 | Chen et al. |
| 7,314,799 B2 * | 1/2008 | Merrett et al. ............... 438/268 |
| 2005/0139936 A1 | 6/2005 | Li |

* cited by examiner

*Primary Examiner*—Michael S Lebentritt
(74) *Attorney, Agent, or Firm*—Jacqueline J. Garner; Wade J. Brady, III; Frederick J. Telecky, Jr.

(57) ABSTRACT

A method (100) of forming semiconductor structures (202) including high-temperature processing steps (step 118), incorporates the use of a high-temperature nitride-oxide mask (220) over protected regions (214) of the device (202). The invention has application in many different embodiments, including but not limited to, the formation of recess, strained device regions (224).

6 Claims, 3 Drawing Sheets

METHODS, SYSTEMS AND STRUCTURES FOR FORMING SEMICONDUCTOR STRUCTURES INCORPORATING HIGH-TEMPERATURE PROCESSING STEPS

This is a divisional application of Ser. No. 11/046,141 filed Jan. 28, 2005.

FIELD OF INVENTION

The present invention relates generally to semiconductor devices and more particularly to methods, structures and systems for performing high temperature processing in the formation of semiconductor devices where there are processing differences between the n and p versions of the device.

BACKGROUND OF THE INVENTION

A conventional field effect transistor (FET), also known as a metal oxide semiconductor (MOS) transistor, generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

The formation of semiconductor devices, including field effect transistors, often requires high temperature processing steps. For example, for a given electric field across the channel of a MOS transistor, the amount of current that flows through the channel is directly proportional to a mobility of carriers in the channel. Thus the higher the mobility of the carriers in the channel, the more current can flow and the faster a circuit can perform. One way to increase the mobility of the carriers in the channel of an MOS transistor is to produce a mechanical stress in the channel. However, the formation of a strained channel typically requires a high temperature processing step sufficient to destroy a conventional photoresist mask.

Another example of a high temperature processing step is the formation of a layer that is deposited on top of the poly silicon, known as a poly cap, in the formation of semiconductor devices. While desirable from a standpoint of device performance, the temperatures needed to form a poly cap are sufficient to destroy conventional photoresist masks.

It would be advantageous to provide methods and systems facilitating the performance of high-temperature processing steps in the manufacture of semiconductor devices.

SUMMARY OF THE INVENTION

New and improved methods and systems are provided for using nitride and nitride-oxide layers to facilitate the performance of high-temperature processing steps in the manufacture of semiconductor devices.

When differential processing is required for the N and P types of a CMOS device, photoresists have traditionally been used to mask the regions which need to be kept from the processing step. This works well for low temperature processes such as the implants, etches and cleans. However, as noted above, high temperature processing can destroy photoresist masks. The present inventors have thus recognized a need for a film that can protect unprocessed areas of the semiconductor device during high-temperature steps. The invention uses an oxide or a nitride or a combination thereof to accomplish this task. Conventional photoresist is used to remove the film from the regions where the processing can take place while, in accordance with the present invention, the other regions of the high-temperature masking layer remains to protect the underlying silicon layer from being processed.

In accordance with one aspect of the present invention there is provided a process of forming a semiconductor structure, comprising: providing a semiconductor substrate; forming a masking layer of a high-temperature masking material conformally over the semiconductor substrate; patterning, using a photoresist mask, portions of the masking layer to selectively leave portions of the masking layer over portions of the semiconductor substrate; and performing a high-temperature processing step using the remaining portions of the masking layer to protect underlying regions of the semiconductor substrate.

In accordance with another aspect of the present invention there is provided a process of, forming a field effect transistor device, comprising: providing a semiconductor substrate having at least one NMOS and at least one PMOS device region; forming a masking layer or of a high-temperature masking material conformally over the semiconductor substrate; patterning, using a photoresist mask, portions of the masking layer to selectively removing the portions of the masking layer over least one of the NMOS and PMOS device regions; removing the photoresist mask; and performing at least one high-temperature processing step over the exposed device region using the remaining portion of the masking layer to protect the unexposed device region.

In accordance with yet another aspect of the present invention, there is provided a semiconductor device structure developed in the formation of a field effect transistor device, comprising: a semiconductor substrate having at least one NMOS and at least one PMOS device region; a masking layer or of a high-temperature masking material conformally over the semiconductor substrate; a photoresist mask positioned to selectively removing portions of the masking layer over least one of the NMOS and PMOS device regions; and means for performing at least one high-temperature processing step over the exposed device region using the remaining portion of the masking layer to protect the unexposed device region.

BRIEF DESCRIPTION OF THE DRAWINGS

These and other objects, features and advantages of the invention will be apparent from a consideration of the following detailed description of the invention when read in conjunction with the drawing Figures, in which.

DETAILED DESCRIPTION OF THE INVENTION

Figure 1:
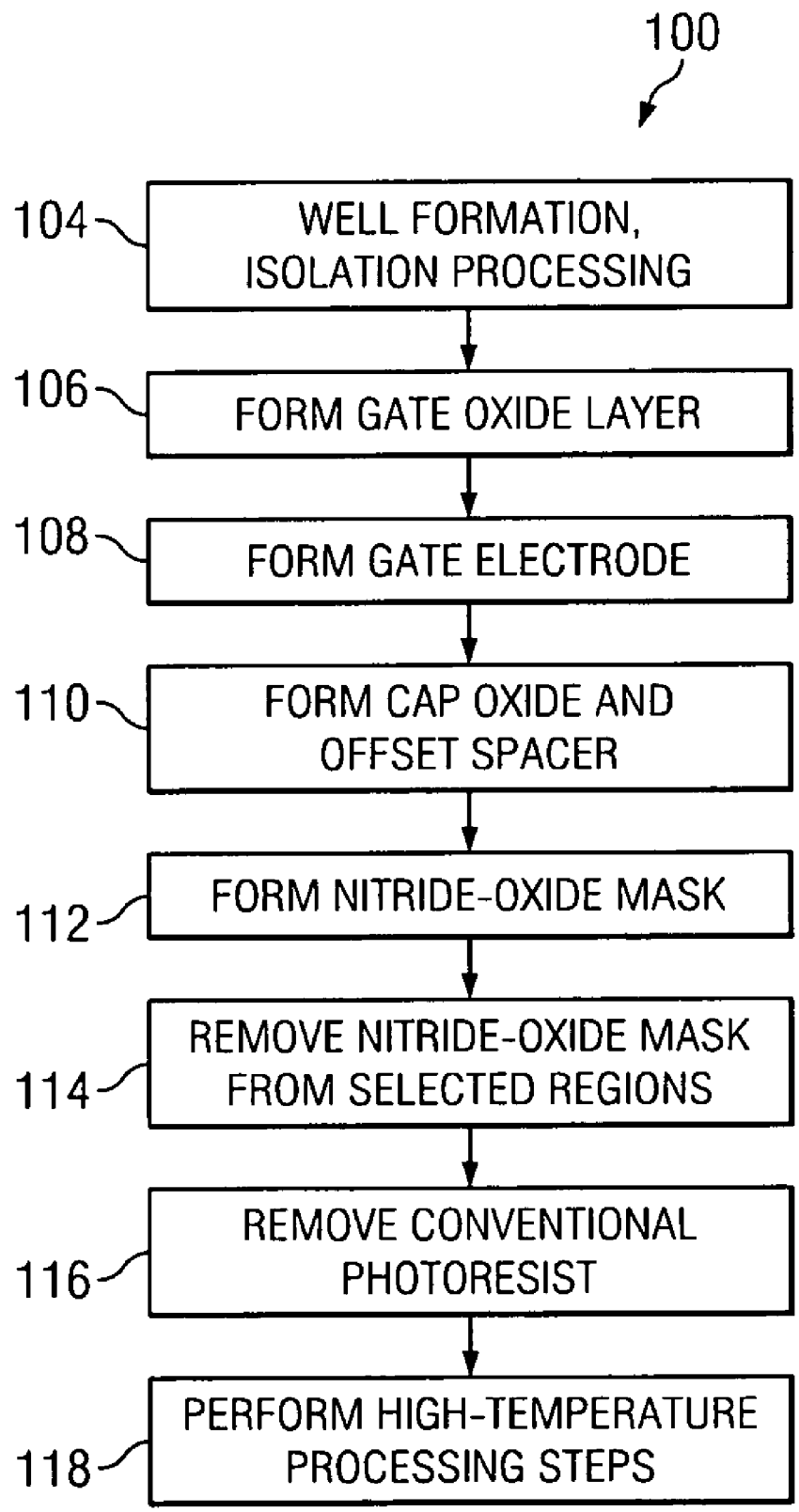
FIG. 1 is a flow chart illustrating a method of performing a high temperature processing step in the fabrication of a semiconductor device in accordance with one aspect of the present invention.

One or more implementations of the present invention will now be described with reference to the attached drawings, wherein like reference numerals are used to refer to like elements throughout, and wherein the illustrated structures are not necessarily drawn to scale. The invention facilitates the manufacture of transistor structures requiring high-temperature processing steps.

Referring now to FIGS. 1 and 2A-2F, further aspects of the invention relate to methods of fabricating integrated circuits, wherein FIG. 1 illustrates an exemplary method 100 in accordance with the invention, and FIGS. 2A-2F illustrate an exemplary transistor device at various stages of fabrication in accordance with the invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated.

The method 100 begins at step 104 with transistor well formation and isolation processing performed in preparation for the manufacture of a CMOS integrated circuit. Act 104 thus defines NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) and/or other isolation structures that serve to define various active areas and electrically isolate various active areas from one another.

Figure 2A:
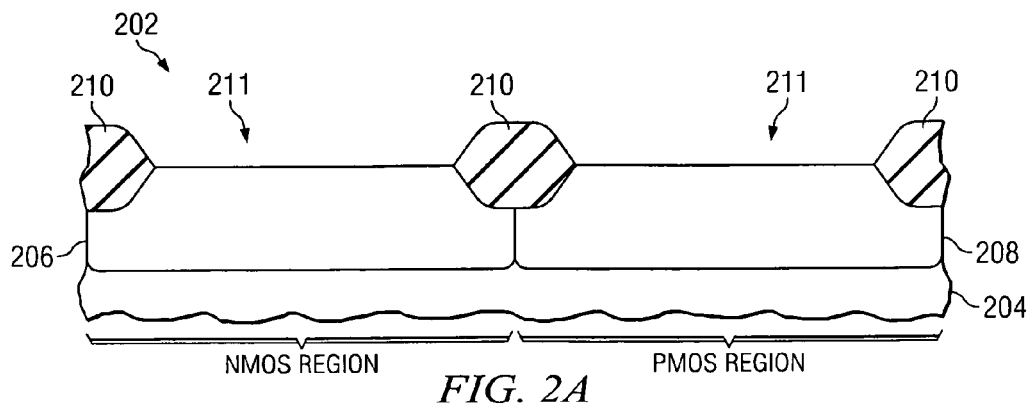
FIGS. 2A-F are fragmentary cross-sectional diagrams illustrating various steps of forming semiconductor device structures in accordance with the process of FIG. 1.

The corresponding structure is shown in FIG. 2A, wherein a transistor device 202 is provided, including a semiconductor body 204, such as a substrate, having a number of wells formed therein, such as a P-well 206 to define an NMOS transistor device region and an N-well 208 to define a PMOS transistor device region, respectively. Further, isolation regions 210 such as STI regions are formed in the semiconductor body to define active area regions 211.

The method 100 continues at 106, wherein a gate oxide layer is formed in active areas defined by the various formed isolation regions. In one example, the gate oxide comprises a thin, thermally grown silicon dioxide layer, however, other types of a gate dielectrics (such as high-k dielectrics) may be formed and are contemplated by the present invention. A conductive gate layer is then deposited over the gate oxide at 108 and patterned to form a conductive gate electrode. For example, a polysilicon layer may be deposited via chemical vapor deposition (CVD) and patterned via etching to form gate electrodes in both NMOS and PMOS regions, respectively.

Figure 2B:
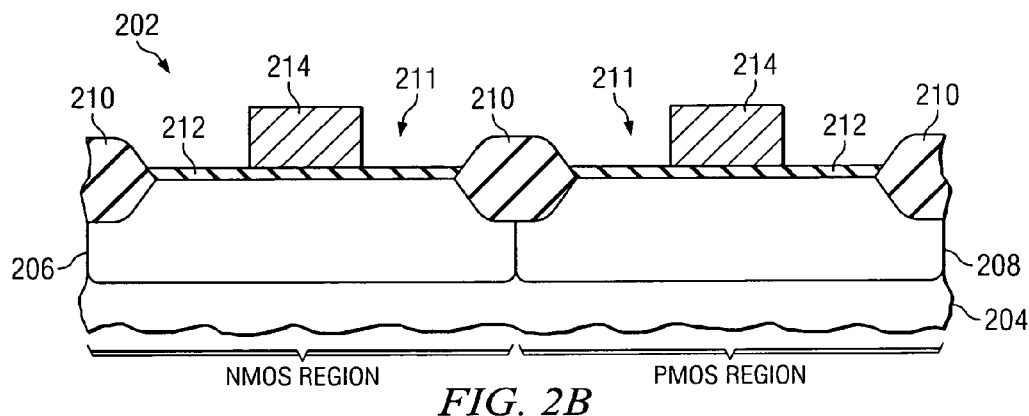

In FIG. 2B, the transistor device 202 is illustrated, wherein a gate oxide 212 has been formed, for example, thermally grown $SiO_2$, over the active areas 211. A patterned polysilicon gate 214 is shown positioned generally centrally over each of the PMOS and CMOS regions, overlying the upper surface of oxide layer 212.

A cap layer is formed conformally over the device, and an offset spacer is then formed on the lateral edges of the conductive gate electrodes at step 110 of FIG. 1. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

Figure 2C:
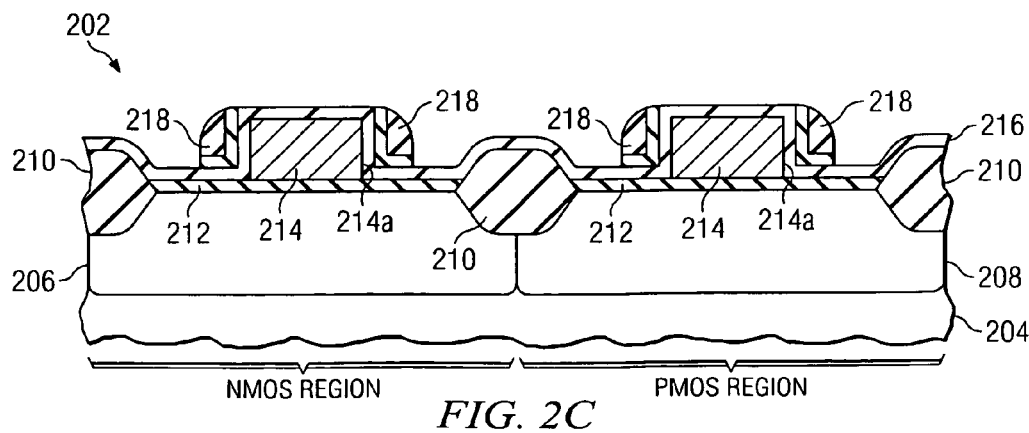

In FIG. 2C, the transistor device 202 is shown including a layer of cap oxide 216 formed conformally over the surface of device 202, including gate regions 214. Sidewall spacers 218 are showing formed on the vertical edges of gate regions 214.

Figure 2D:
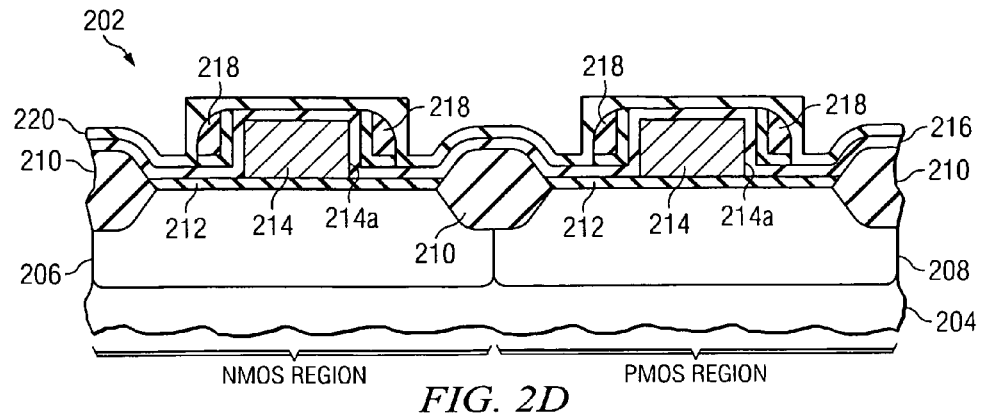

With reference back to FIG. 1, a high-temperature masking layer is formed in step 112 conformally over the upper surface of device 202. In accordance with the present invention, this masking layer may comprise a layer of nitride, a layer of oxide and/or a layer of oxide-over-nitride. These films preferably have a thickness in the range of about 5 to 150 nms. With reference to FIG. 2D, a layer 220 of oxide, nitride or oxide-over-nitride is shown conformally deposited over the upper surface of device 202 to function as a high-temperature process mask.

Figure 2E:
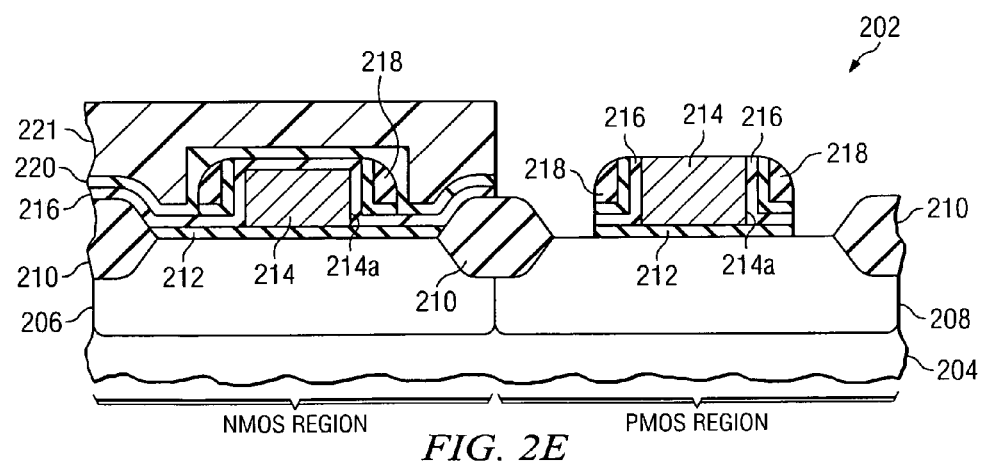

With reference back to FIG. 1, the high-temperature masking layer is selectively renewed from portions of the device, step 114, using conventional photoresist and etching techniques. With reference to FIG. 2E, layers 220 and 216 are shown selectively removed over areas of device 202 using conventional photoresist mask 221 and etching techniques. It will be understood that layer 220 is selectively removed over portions of device 202 where it's presence will not be required to facilitate subsequent high-temperature processing steps. In the present embodiment of the invention, for purposes of illustration, layer 220 is shown removed over the PMOS region of device 202, while being left over the NMOS region of the device. It will be understood that, in accordance with the present invention, the remaining portion of layer 220 has a substantially greater resistance to high temperatures then does photoresist 221

Figure 2F:
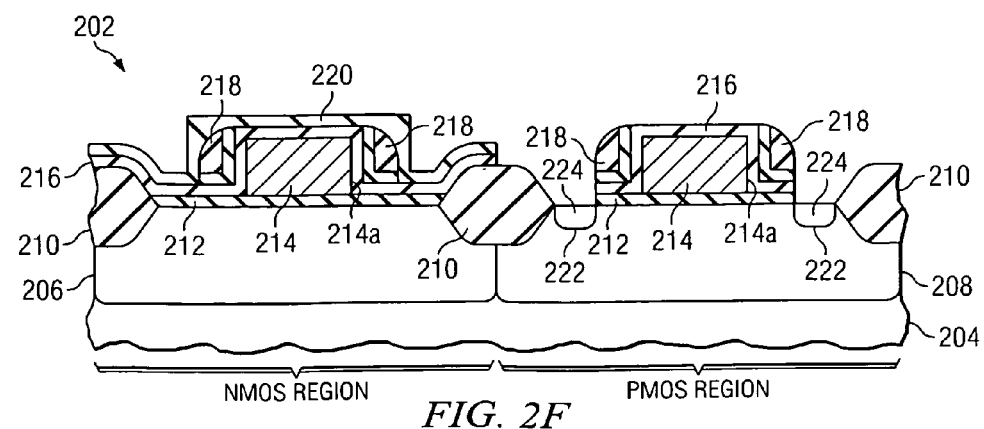

Following the removal of the conventional photoresist, step 116, high temperature processing step(s) 118 may be utilized to continue the manufacture of the semiconductor device. With reference to FIG. 2F, one use of the present invention, is illustrated wherein recesses 222 are formed in the active areas of the PMOS device region, using as a mask the photoresist used to pattern layers 216 and 220, the gate electrode 214 and isolations areas 210.

Using the same masking elements, a deposition process is provided wherein a carbon-doped silicon material 224 is formed in the recesses 222. In accordance with the present invention, the conventional photoresist region 221 is removed and a thermal process such as a rapid thermal anneal is then performed to activate the dopant.

It will be appreciated that the rapid thermal anneal, typically performed at a temperature in the range of 900 to 1100 C, would destroy the conventional photoresist. In accordance with the present invention, however, layer 220 functions as a high-temperature masking layer 220 sufficiently resistant to high temperatures so as to protect the masked regions of the device during the rapid thermal anneal.

It will be understood that, while the invention has been illustrated and described with respect to the formation of a strained region in a field effect transistor, it is equally applicable with any high-temperature semiconductor fabrication process. Examples wherein a high-temperature oxide, nitride or oxide-over-nitride masking region may be used include, but are not limited to: 1) the creation of recessed, strained device regions, including silicon-carbon and silicon-germanium regions, 2) the formation of capped polysilicon gate regions, 3) the formation of a metal gate, and others as will now be apparent to the reader. Further, the photoresist mask used to pattern the high-temperature mask may be used, prior to removal, in other processing steps including but not limited to performing a doping implantation in at least one region of the field effect transistor and/or in the formation of dual thickness gate oxides.

While the invention has been illustrated and described with respect to one or more embodiments, numerous alterations and/or modifications may be made to the illustrated examples without departing from the spirit and scope of the appended claims.

What is claimed is:

1. A semiconductor device structure developed in the formation of a field effect transistor device, comprising:
   a semiconductor substrate having at least one NMOS and at least one PMOS device region;
   a masking layer or of a high-temperature masking material conformally over the semiconductor substrate;
   a photoresist mask positioned to selectively removing portions of the masking layer over least one of the NMOS and PMOS device regions; and
   means for performing at least one high-temperature processing step over the exposed device region using the remaining portion of the masking layer to protect the unexposed device region.

2. The device of claim 1 wherein the masking layer is selected from the group comprising oxide, nitride and a combination of oxide and nitride.

3. The device of claim 1 wherein the high-temperature masking material is positioned to enable the formation of a film selected from the group including SiGe and SiC.

4. The device of claim 1 wherein the high-temperature masking material is positioned to enable a metal gate formation.

5. The device of claim 1 wherein the photoresist mask is further positioned to perform a doping implantation in at least one region of the field effect transistor.

6. The device of claim 1 wherein the photoresist mask the photoresist mask is further positioned to enable the formation of dual thickness gate oxides.

* * * * *